United States Patent
Liao et al.

(10) Patent No.: US 8,962,433 B2
(45) Date of Patent: Feb. 24, 2015

(54) MOS TRANSISTOR PROCESS

(75) Inventors: Chin-I Liao, Tainan (TW); Chin-Cheng Chien, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/494,016

(22) Filed: Jun. 12, 2012

(65) Prior Publication Data

US 2013/0330898 A1  Dec. 12, 2013

(51) Int. Cl.
*H01L 21/336* (2006.01)

(52) U.S. Cl.
USPC ........... 438/300; 438/301; 438/305; 438/607; 438/783

(58) Field of Classification Search
USPC .......................... 438/300, 783, 301, 305, 607
See application file for complete search history.

(56) References Cited

U.S. PATENT DOCUMENTS

| | | | |
|---|---|---|---|
| 7,550,336 B2 | 6/2009 | Hsiao | |
| 2005/0095795 A1* | 5/2005 | Son et al. | 438/300 |
| 2007/0063273 A1* | 3/2007 | Yoneda | 257/333 |
| 2007/0072376 A1 | 3/2007 | Chen | |
| 2007/0111416 A1* | 5/2007 | Huang et al. | 438/197 |
| 2007/0138570 A1 | 6/2007 | Chong | |
| 2008/0061366 A1 | 3/2008 | Liu | |
| 2008/0268601 A1* | 10/2008 | Choi | 438/300 |
| 2009/0256160 A1* | 10/2009 | Liu et al. | 257/77 |
| 2009/0267116 A1* | 10/2009 | Wu et al. | 257/194 |
| 2009/0280612 A1* | 11/2009 | Shimamune et al. | 438/300 |
| 2010/0210084 A1* | 8/2010 | Yang et al. | 438/285 |
| 2011/0230027 A1 | 9/2011 | Kim | |
| 2012/0052644 A1 | 3/2012 | Lu | |
| 2012/0058614 A1* | 3/2012 | Nguyen et al. | 438/264 |

\* cited by examiner

*Primary Examiner* — Kyoung Lee
*Assistant Examiner* — Ratisha Mehta
(74) *Attorney, Agent, or Firm* — Winston Hsu; Scott Margo

(57) ABSTRACT

A MOS transistor process includes the following steps. A gate structure is formed on a substrate. A source/drain is formed in the substrate beside the gate structure. After the source/drain is formed, (1) at least a recess is formed in the substrate beside the gate structure. An epitaxial structure is formed in the recess. (2) A cleaning process may be performed to clean the surface of the substrate beside the gate structure. An epitaxial structure is formed in the substrate beside the gate structure.

9 Claims, 4 Drawing Sheets

MOS TRANSISTOR PROCESS

BACKGROUND OF THE INVENTION

1. Field of the Invention

The present invention relates generally to a MOS transistor process, and more specifically to a MOS transistor process, that forms a recess and/or performs a cleaning process after a source/drain is formed and before an epitaxial structure is formed.

2. Description of the Prior Art

For decades, chip manufacturers have made metal-oxide-semiconductor (MOS) transistors faster by making them smaller. As the semiconductor processes advance to very deep sub micron era such as 65-nm node or beyond, how to increase the driving current of MOS transistors has become a critical issue. In order to improve device performances, crystal strain technology has been developed. Crystal strain technology is becoming more and more attractive as a mean for reaching better performances in the field of CMOS transistor fabrication. Putting a strain on a semiconductor crystal alters the speed at which charges move through that crystal. Strain makes CMOS transistors work better by enabling electrical charges, such as electrons, to pass more easily through the silicon lattice of the gate channel.

In the known arts, attempts have been made to use a strained silicon layer, which has been grown epitaxially on a silicon substrate with an epitaxial structure such as a silicon germanium (SiGe) structure or a silicon carbide (SiC) structure disposed in between. In this type of MOS transistor, a biaxial compressive or tensile strain occurs in the epitaxial structure due to the silicon germanium or the silicon carbide which has a less or larger lattice constant than silicon, and, as a result, the band structure is altered, and the carrier mobility increases. This enhances the speed performance of the MOS transistors.

However, ingredients in the epitaxial structure such as germanium or carbon etc would diffuse outwards when induced by high temperature or ion implantation etc, thereby decreasing the concentration of the ingredients in the epitaxial structure, and degrading the performance of the epitaxial structure. Moreover, the qualities of the surface of a substrate having the epitaxial structure formed thereon will also affect the shape or the cross-sectional profile etc. of the epitaxial structure, which would affect the performances of formed semiconductor component.

SUMMARY OF THE INVENTION

The present invention provides a MOS transistor process, which forms epitaxial structures after source/drains are formed, and forms recesses or performs a cleaning process after the source/drains are formed and before the epitaxial structures are formed, so that the performances of the epitaxial structures can be improved.

The present invention provides a MOS transistor process including the following steps. A gate structure is formed on a substrate. A source/drain is formed in the substrate beside the gate structure. At least a recess is formed in the substrate beside the gate structure after the source/drain is formed. An epitaxial structure is formed in the recess.

The present invention provides a MOS transistor process including the following steps. A gate structure is formed on a substrate. A source/drain is formed in the substrate beside the gate structure. A cleaning process is performed to clean the surface of the substrate beside the gate structure after the source/drain is formed. An epitaxial structure is formed in the substrate beside the gate structure.

According to the above, the present invention provides a MOS transistor process, which forms source/drains, forms recesses and/or performs a cleaning process, and then forms epitaxial structures. This way, outward diffusion of the ingredients in the epitaxial structures caused by a source/drain ion implantation process and a source/drain annealing process for forming the source/drains can be avoided, that would decrease stresses forcing gate channels from the epitaxial structures and lead to circuit leakages in the gate channels. Moreover, the recesses are formed, or the cleaning process is performed, after the source/drains are formed, so that the substrate damaged during processes such as processes for forming source/drains, or impurities on the substrate can be removed, thereby improving the performances of the epitaxial structure formed on the substrate.

These and other objectives of the present invention will no doubt become obvious to those of ordinary skill in the art after reading the following detailed description of the preferred embodiment that is illustrated in the various figures and drawings.

DETAILED DESCRIPTION

The MOS transistor process of the present invention can be applied in a gate-first process, a gate-last for high-k first process or a gate-last for high-k last process etc. Moreover, planar MOS transistors are used as an example in the following, but the present invention can also be applied to non-planar MOS transistors such as Multi-gate MOSFETs like fin-shaped field effect transistors (FinFET) or tri-gate MOSFETs. One embodiment is presented later, wherein planar MOS transistors use a gate-last for high-k first process, but it is not limited thereto.

Figure 1:
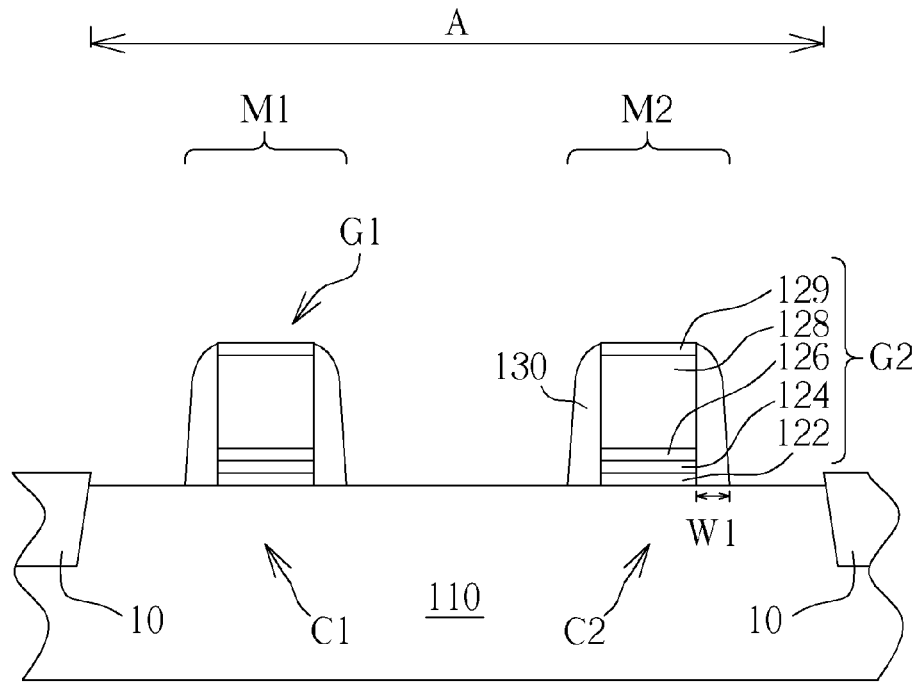
FIGS. 1-8 schematically depict cross-sectional views of a MOS transistor process according to an embodiment of the present invention.

FIGS. 1-8 schematically depict cross-sectional views of a MOS transistor process according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. An isolation structure 10 is formed in the substrate 110 to electrically isolate transistors in each area. The isolation structure 10 may be a shallow trench isolation (STI) structure formed by methods such as a shallow trench isolation (STI) process. The details of the methods for forming the shallow trench isolation (STI) structure are known in the art, and won't be described herein. In this embodiment, two transistors M1 and M2 having a common source or a common drain are formed in an area A, but it is not limited thereto. In another embodiment, a single transistor or a plurality of transistors with no common sources or common drains may be formed in the area A.

A buffer layer (not shown), a dielectric layer (not shown), a barrier layer (not shown), an electrode layer (not shown) and a cap layer (not shown) are formed on the substrate 110, and then five of them are patterned to form two gate structures G1 and G2 including a buffer layer 122, a dielectric layer 124, a barrier layer 126, an electrode layer 128 and a cap layer 129. A main spacer material (not shown) is formed to cover the two gate structures G1 and G2 and the substrate 110 and then is etched back to form a main spacer 130 on the substrate 110 beside each of the two gate structures G1 and G2. The width w1 of the main spacer 130 determines the distance between later formed source/drain in the substrate 110 and each of the gate channels C1 and C2.

In aforesaid embodiment, the buffer layer 122 is an oxide layer, which may be formed by a thermal oxide process or a chemical oxide process, but it is not limited thereto. The buffer layer 122 is located between the dielectric layer 124 and the substrate 110 to buffer the dielectric layer 124 and the substrate 110. The buffer layer 122 may be selectively formed depending upon the materials of the dielectric layer 124 and the substrate 110, and the electrical performances of formed semiconductor components. For example, a gate-last for high-k first process is used in this embodiment, the dielectric layer 124 is therefore a dielectric layer having a high dielectric constant, such as the group selected from hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST), but it is not limited thereto. The material difference between the dielectric layer 124 and the substrate 110 can therefore be buffered by the buffer layer 122. In another embodiment, if a gate-last for high-k last process is applied, the dielectric layer 124 may be directly formed on the substrate 110, wherein the dielectric layer 124 may be an oxide layer, which will be removed in a later process, and then the buffer layer 122 is formed on the substrate 110 after the dielectric layer 124 is removed during a metal gate replacement process. The buffer layer 122 may be formed on the substrate 110 before the dielectric layer 124 is formed, so that only the dielectric layer 124 needs to be removed during the metal gate replacement process, without removing the buffer layer 122. In another way, when a polysilicon transistor is formed, the dielectric layer 124 can be an oxide layer, so that the buffer layer 122 and the barrier layer 126 may not need to be formed.

The barrier layer 126 is located on the dielectric layer 124 to be an etching stop layer for protecting the dielectric layer 124 from being damaged while the electrode layer 128 is removed, and to prevent metals formed on the barrier layer 126 from diffusing downwards and pollute the dielectric layer 124. The barrier layer 126 maybe a single layer structure or a multi-layer structure composed of materials such as tantalum nitride (TaN) or titanium nitride (TiN) etc. The electrode layer 128 may be a sacrificial electrode layer composed of materials such as polysilicon, which may be replaced by a metal gate in later processes, but it is not limited thereto. The cap layer 129 may be a single layer or a stacked structure composed of layers such as a nitride layer or an oxide layer etc. The cap layer 129 can prevent layers beneath such as the electrode layer 128 from being damaged in later etching processes, so the materials of the cap layer 129 may depend upon the parameters of the etching processes such as the etchant of the etching processes. The main spacer 130 may be a single layer or a multilayer structure composed of layers such as a nitride layer, an oxide layer or the combination of both, but it is not limited thereto.

Figure 2:
Figure 2:
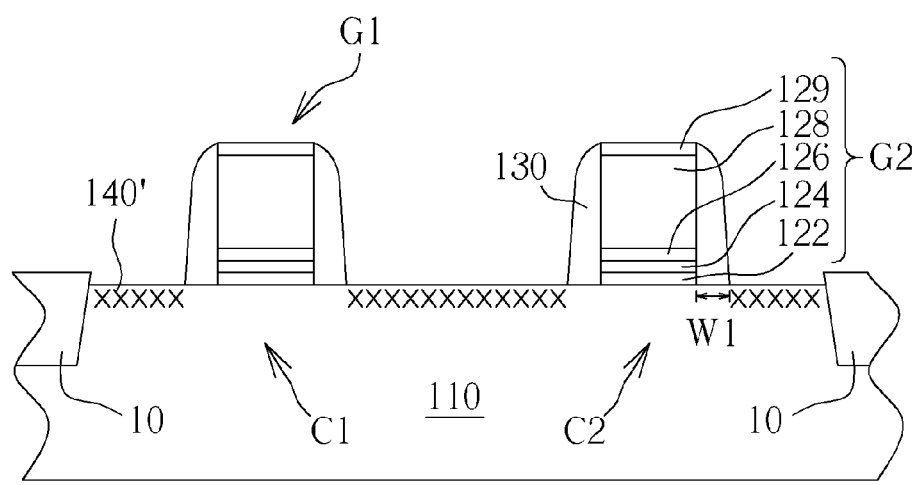
Figure 3:
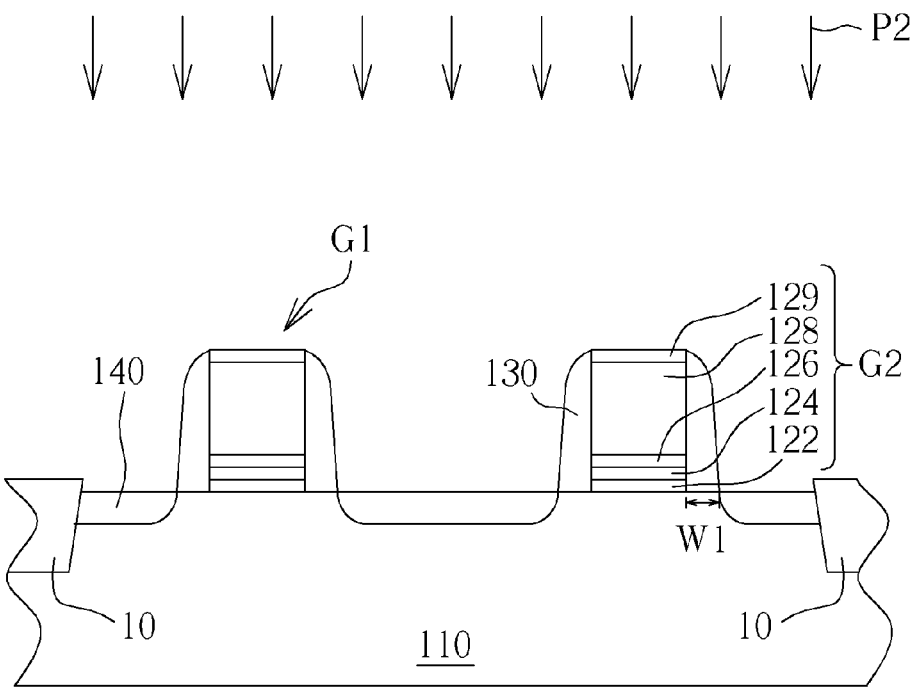

As shown in FIGS. 2-3, a source/drain 140 is formed in the substrate 110 beside each of the gate structures G1 and G2. In details, as shown in FIG. 2, a source/drain ion implantation process P1 is performed to automatically align and form an implanted region 140' in the substrate 110 beside each of the gate structures G1 and G2 by the main spacers 130. As shown in FIG. 3, a source/drain annealing process P2 is performed to activate the implanted regions 140', so that the source/drain 140 can be formed in the substrate 110 beside each of the main spacers 130. Furthermore, a liner spacer (not shown) may be selectively formed on the substrate 110 beside each of the gate structures G1 and G2 before the main spacers 130s are formed, and then a lightly doped source/drain (not shown) is automatically aligned and formed in the substrate 110 beside each of the liner spacers (not shown).

Figure 4:
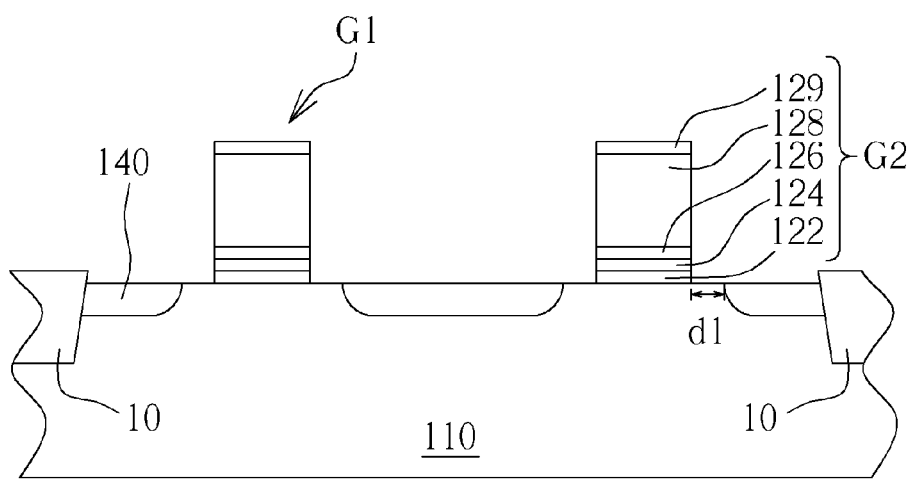

The main spacer 130 is removed, so that the sidewalls of the gate structures G1 and G2 are exposed as shown in FIG. 4. Due to the source/drains 140 being automatically aligned and formed by the main spacers 130, a distance d1 between the source/drain 140 and each of the gate structures G1 and G2 is equal to the width w1 of the main spacer 130 as shown in aforementioned figures. That means the distance d1 van be controlled by adjusting the width w1 of the main spacer 130. In this embodiment, the main spacer 130 is entirely removed; but in another embodiment, the main spacer 130 may be partially removed or not removed. Then, an epitaxial spacer may be formed later on the substrate 110 beside the remaining main spacer 130.

Figure 5:
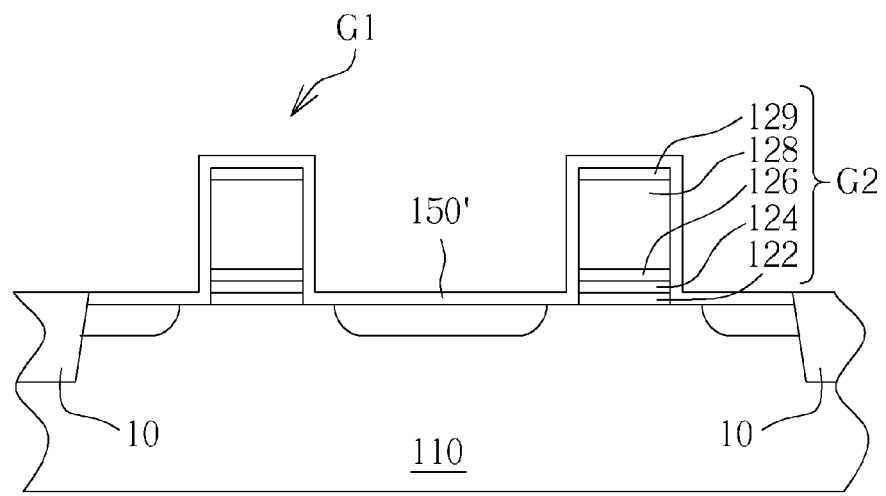
Figure 6:
Figure 6:
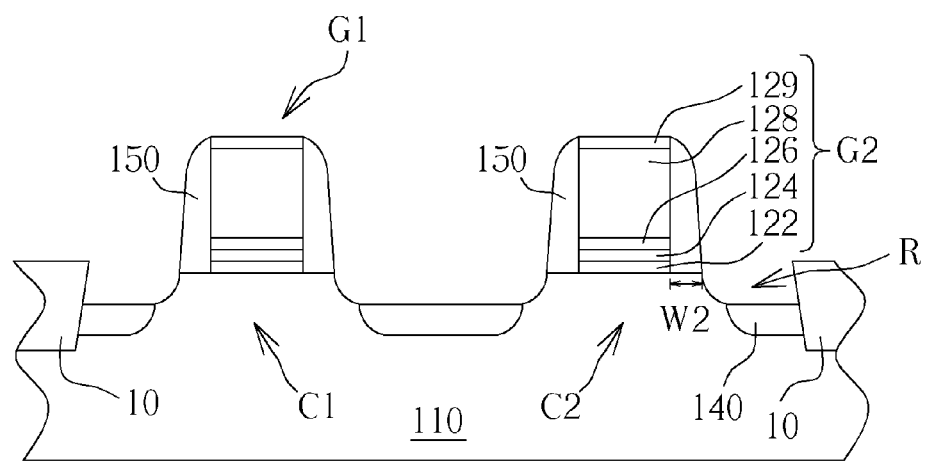

As shown in FIGS. 5-6, an epitaxial spacer 150 is formed on the substrate 110 beside each of the gate structures G1 and G2. In details, as shown in FIG. 5, an epitaxial spacer material 150' may be formed to cover the gate structures G1 and G2 and the substrate 110. As shown in FIG. 6, an etching process P3 is performed to etch the epitaxial spacer material 150' and an epitaxial spacer 150 is therefore formed on the substrate 110 beside each of the gate structures G1 and G2. In this embodiment, not only the epitaxial spacer material 150' is etched during the etching process P3, but also recesses R are formed in the substrate 110 beside the epitaxial spacers 150. Thus, part of the substrate 110 being crystalline damaged can be removed in said processes, especially in the source/drain ion implantation process P1, as the recesses R are formed. For instance, as the depth of the implanted region 140' formed by performing the source/drain ion implantation process P1 is 50 Å (angstroms), the depth of the recesses R is preferred to be 50~65 Å (angstroms). Therefore, the damage part of the substrate 110 can be removed, enabling epitaxial structures being formed in the recesses R having an undamaged surface and the epitaxial structures will have better shapes and better cross-sectional profiles. In another embodiment, the recesses R and the epitaxial spacers 150 maybe formed by different etching processes, and the depth of the recesses R depends upon the needs such as the materials or the characteristics of the formed epitaxial structures. For instance, as the epitaxial structures are carbon containing silicon phosphorus (SiCP) epitaxial structures, the depth of the recesses R is preferred to be 400~500 Å (angstrom). Moreover, a width w2 of the epitaxial spacers 150 will determine the distance between the epitaxial structures formed in the substrate 110 beside the epitaxial spacer 150 and the gate structures G1 and G2 in later processes. In this embodiment, the width w2 of the epitaxial spacers 150 is narrower than the width w1 of the main spacers 130 as shown in previous figures, so that the epitaxial structures formed in later processes can be closer to the gate channels C1 and C2. This way, stresses forcing the gate channels C1 and C2 from the epitaxial structures can be increased, while the source/drains 140 are prevented from being too close to the gate channels C1 and C2, which would cause an electron tunnel effect and induce circuit leakages.

In another embodiment, the distance between the epitaxial structures and the gate channels C1 and C2 and the distance between the source/drains 140 and the gate channels C1 and C2 can be adjusted according to the needs. The adjusting methods may include the following steps. The distance between the source/drain 140 and the gate channels C1 and C2 can be decided by the width w1 of the mainspacers 130. Then, the main spacers 130 are removed partially or entirely, or the main spacer 130 may not be removed, and then the epitaxial spacers 150 can be formed on the substrate 110 at the original position of the main spacers 130 and/or beside the main spacers 130. So, the distance between the epitaxial structures and the gate channels C1 and C2 can be controlled by the remaining main spacers 130 and the width w2 of the epitaxial spacers 150.

Figure 7:
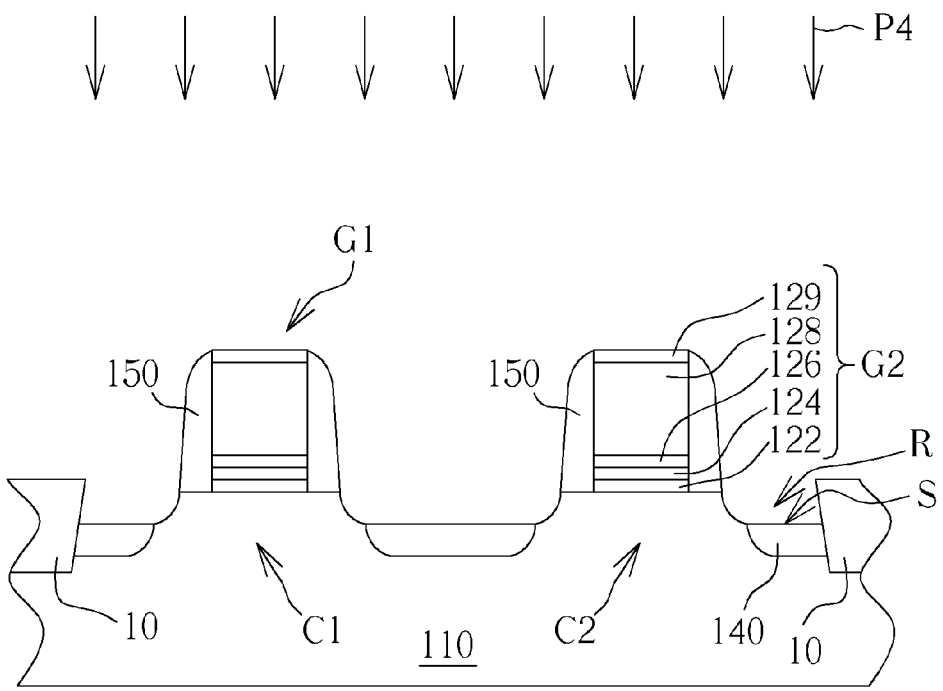

As shown in FIG. 7, a cleaning process P4 is performed to clean the surface S of the recesses R, to remove impurities such as residues or native oxides etc, so that the epitaxial structures formed in the recesses R can have better shapes and cross-sectional profiles, and the formed semiconductor component can achieve better performances. The cleaning process P4 may include a Standard Clean 1 (SC1) process and/or a dilute hydrofluoric acid containing cleaning process. In an embodiment, a Standard Clean 1 (SC1) process is performed to oxidize the surface S of part of the recesses R, and then a dilute hydrofluoric acid containing cleaning process is performed to remove oxide and other impurities on the surface S and repair the surface S of the recesses R, but it is not limited thereto. In this embodiment, a first Standard Clean1 (SC) process, a dilute hydrofluoric acid containing cleaning process and a second Standard Clean 1 (SC1) process are sequentially performed. Specifically, the first Standard Clean 1 (SC1) process is firstly performed, wherein the first Standard Clean 1 (SC1) process is a "multi-wafer at once" cleaning process, and the processing temperature of the first Standard Clean 1 (SC1) process is 70° C. and the processing time is 60 seconds; then, the dilute hydrofluoric acid containing cleaning process and the second Standard Clean 1 (SC1) process are sequentially performed, wherein the dilute hydrofluoric acid containing cleaning process and the second Standard Clean 1 (SC1) process are "one wafer at once" cleaning processes, and the processing time of the dilute hydrofluoric acid containing cleaning process is 15 seconds, and the processing temperature of the second Standard Clean 1 is 60° C. and the processing time is 90 seconds.

Figure 8:
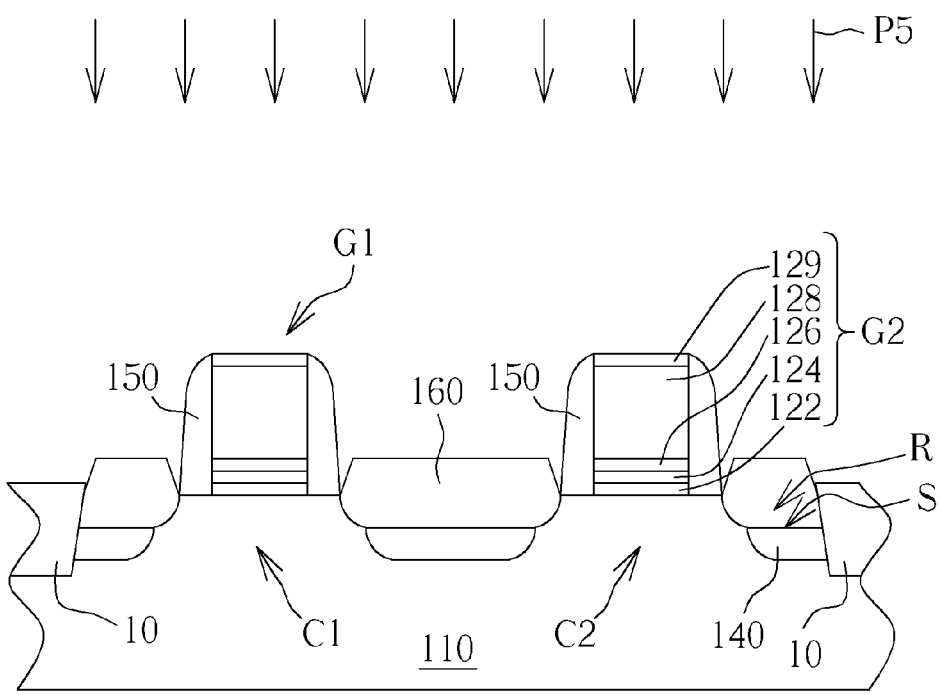

As shown in FIG. 8, an epitaxial process P5 is performed to form an epitaxial structure 160 in each of the recesses R. The epitaxial structure 160 may be a silicon phosphorus (SiP) epitaxial structure, a silicon germanium (SiGe) epitaxial structure or a carbon containing silicon phosphorus (SiCP) epitaxial structure, but it is not limited thereto. The structure depends upon the types of formed transistors. In this embodiment, the epitaxial structure 160 is a silicon phosphorus (SiP) epitaxial structure of an NMOS transistor. The ingredients in the epitaxial structure 160, such as phosphorus, is eager to diffuse outwards, which means that the ingredients in the epitaxial structure 160, such as phosphorus, have high sensitivities with ion implantations or high temperatures. The epitaxial structure 160 are formed after the source/drains 140 are formed, so that the epitaxial structures 160 will not suffer the affection of the source/drain ion implantation process P1 and the source/drain annealing process P2. Therefore, the ingredients in the epitaxial structures 160 can be prevented from diffusing outwards, which would reduce the stresses applied on the gate channels C1 and C2 from the epitaxial structures 160, and lead to circuit leakages. Moreover, there may be dopants doped into the epitaxial structures 160 to induce the epitaxial structures 160 to be conductive, wherein the dopants may be boron or phosphorus etc, depending upon the electrical types. The dopants may be in-situ doped into the epitaxial structures 160 during the epitaxial process P5. The dopants may diffuse into the epitaxial structures 160 from the source/drains 140; or they may be ion implanted into the epitaxial structures 160 after the epitaxial structures 160 are formed.

Above all, in the present invention, the recesses R are formed in the substrate 110 beside the gate structures G1 and G2 after the source/drains 140, the cleaning process P4 is performed to clean the surface S of the recesses R, and then the epitaxial structures 160 are formed. By doing this, the epitaxial structures 160 suffering from the damages of the ion implantation process of the source/drains 140 and form the high temperature of the annealing process of the source/drains 140 can be avoided. Moreover, the recesses R formed after the source/drains 140 can remove the damaged substrate 110 during the processes such as processes for forming the source/drains 140, thereby improving the performances of the epitaxial structures 160 formed in the recesses R. Furthermore, the cleaning process P4 is performed after the recesses R are formed, so that the surface S of the recesses R can be cleaned, and the performances of the epitaxial structures 160 formed in the recesses R can be improved.

However, the steps of forming the source/drains 140, forming the recesses R, performing the cleaning process P4, and forming the epitaxial structures 160 are just one embodiment of the present invention. Since forming the recesses R and performing the cleaning process P4 can improve the surface quality of the substrate 110, thereby improving the performances of the epitaxial structures 160, the recesses R formation only or the cleaning process P4 only may be carried out after the source/drains 140 are formed and before the epitaxial structures 160 are formed, in order to achieve the purposes of the present invention. However, it is preferred to form the recesses R and then perform the cleaning process P4 to obtain better performances of the epitaxial structures 160.

To summarize, the present invention provides a MOS transistor process, which forms source/drains, forms recesses and/or performs a cleaning process, and then forms epitaxial structures. This way, outward diffusion of the ingredients in the epitaxial structures caused by a source/drain ion implantation process and a source/drain annealing process for forming the source/drains can be avoided, which would decrease the stresses forcing gate channels from the epitaxial structures and lead to circuit leakages in the gate channels. Moreover, the recesses may be formed after the source/drains are formed, so that the substrate damaged during processes, such as processes for forming source/drains, are removed, thereby improving the performances of the epitaxial structures formed in the recess. A cleaning process may be performed after the source/drain are formed, so that impurities on the surface of the substrate can be removed, thereby improving the performances of the epitaxial structure formed on the substrate. Preferably, the recess is formed and then the cleaning process is performed, after the source/drains are formed and before the epitaxial structures are formed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A MOS transistor process, comprising:
   forming a gate structure on a substrate;
   forming a source/drain in the substrate beside the gate structure;
   covering an epitaxial spacer material on the gate structure and the substrate;

performing a single etching process to uninterruptedly form an epitaxial spacer on the substrate beside the gate structure and at least a recess in the substrate beside the gate structure after the source/drain is formed; and forming an epitaxial structure in the recess, wherein the epitaxial structure is closer to the gate structure than the source/drain.

2. The MOS transistor process according to claim 1, wherein steps of forming the source/drain comprise:

performing a source/drain ion implantation process in the substrate beside the gate structure to form an implanted region; and performing a source/drain annealing process to activate the implanted region to form the source/drain.

3. The MOS transistor process according to claim 1, further comprising:

performing a cleaning process to clean the surface of the recess after the recess is formed and before the epitaxial structure is formed.

4. The MOS transistor process according to claim 3, wherein the cleaning process comprises a Standard Clean 1 (SC1) process or/ and a dilute hydrofluoric acid containing cleaning process.

5. The MOS transistor process according to claim 4, wherein the cleaning process comprises sequentially performing a first Standard Clean 1 (SC1) process, a dilute hydrofluoric acid containing cleaning process and a second Standard Clean 1 (SC1) process.

6. The MOS transistor process according to claim 5, wherein the processing temperature of the first Standard Clean 1 (SC1) process is 70° C. and the processing time is 60 seconds, the processing time of the dilute hydrofluoric acid containing cleaning process is 15 seconds, and the processing temperature of the second Standard Clean 1 (SC1) process is 60° C. and the processing time is 90 seconds.

7. The MOS transistor process according to claim 1, further comprising:

forming a main spacer on the substrate beside the gate structure after the gate structure is formed, and the source/drain is formed in the substrate beside the main spacer.

8. The MOS transistor process according to claim 1, wherein the epitaxial structure comprises a silicon phosphorus (SiP) epitaxial structure, a silicon germanium (SiGe) epitaxial structure or a carbon containing silicon phosphorus (SiCP) epitaxial structure.

9. The MOS transistor process according to claim 7, further comprising:

removing the main spacer;

covering an epitaxial spacer material on the gate structure and the substrate; and performing an etching process to form an epitaxial spacer on the substrate beside the gate structure and form the recess in the substrate beside the epitaxial spacer.

* * * * *